(12) United States Patent
Suhara

(10) Patent No.: US 10,814,423 B2
(45) Date of Patent: Oct. 27, 2020

(54) OPTICAL PROCESSING APPARATUS, METHOD FOR OPTICAL PROCESSED OBJECT

(71) Applicant: Hiroyuki Suhara, Yokohama (JP)

(72) Inventor: Hiroyuki Suhara, Yokohama (JP)

(73) Assignee: RICOH COMPANY, LIMITED, Tokyo (JP)

(*) Notice: Subject to any disclaimer, the term of this patent is extended or adjusted under 35 U.S.C. 154(b) by 318 days.

(21) Appl. No.: 15/870,490

(22) Filed: Jan. 12, 2018

(65) Prior Publication Data
US 2018/0257173 A1 Sep. 13, 2018

(30) Foreign Application Priority Data

Mar. 8, 2017 (JP) ................................ 2017-043970

(51) Int. Cl.
| B23K 26/04 | (2014.01) |
| H05K 3/00 | (2006.01) |
| B23K 26/066 | (2014.01) |
| B23K 26/06 | (2014.01) |
| B23K 26/073 | (2006.01) |

(52) U.S. Cl.
CPC ......... *B23K 26/048* (2013.01); *B23K 26/043* (2013.01); *B23K 26/066* (2015.10); *B23K 26/0643* (2013.01); *B23K 26/0648* (2013.01); *B23K 26/0736* (2013.01); *H05K 3/0023* (2013.01); *H05K 3/0026* (2013.01)

(58) Field of Classification Search
CPC .............. B23K 26/048; B23K 26/0643; B23K 26/0736; B23K 26/0648; B23K 26/043; B23K 26/066; H05K 3/0023; H05K 3/0026
See application file for complete search history.

(56) References Cited

U.S. PATENT DOCUMENTS

| 5,667,707 A * | 9/1997 | Klingel ................ B23K 26/046 219/121.67 |
| 5,684,642 A * | 11/1997 | Zumoto ............... B23K 26/032 359/739 |
| 5,834,766 A | 11/1998 | Suhara |
| 6,376,837 B1 | 4/2002 | Itabashi et al. |
| 6,555,810 B1 | 4/2003 | Suhara |

(Continued)

FOREIGN PATENT DOCUMENTS

| JP | 2005-224841 A | 8/2005 |
| JP | 2008-36641 A | 2/2008 |

*Primary Examiner* — Donnell A Long
(74) *Attorney, Agent, or Firm* — Oblon, McClelland, Maier & Neustadt, L.L.P.

(57) ABSTRACT

An optical processing apparatus includes a light source, a condensing optical system, and a shaping optical system. The light source emits light. The condensing optical system condenses the light emitted from the light source onto a processing target position on a surface of an object to be processed. The shaping optical system shapes a spot shape of the condensed light, such that a ratio of a major axis diameter of the spot shape to a minor axis diameter of the spot shape, in a cross section orthogonal to an optical axis of the condensed light on the object to be processed, is a minimum at or adjacent to a focal position of the shaping optical system. A method for optically processing an object is also provided.

10 Claims, 14 Drawing Sheets

(56) References Cited

U.S. PATENT DOCUMENTS

| | | | |
|---|---|---|---|
| 8,395,084 B2 * | 3/2013 | Tanaka | B23K 26/0738 |
| | | | 219/121.6 |
| 8,411,123 B2 | 4/2013 | Suhara | |
| 8,451,309 B2 | 5/2013 | Suhara | |
| 9,146,493 B2 | 9/2015 | Suhara et al. | |
| 9,235,154 B2 | 1/2016 | Suhara et al. | |
| 9,513,573 B2 | 12/2016 | Tachibana et al. | |
| 9,517,636 B2 | 12/2016 | Suhara | |
| 9,778,592 B2 | 10/2017 | Suhara et al. | |
| 9,817,330 B2 | 11/2017 | Tachibana et al. | |
| 10,239,155 B1 * | 3/2019 | Stewart | B23K 26/36 |
| 2008/0200441 A1 | 8/2008 | Brinton et al. | |
| 2009/0147330 A1 * | 6/2009 | Seo | B23K 26/38 |
| | | | 359/11 |
| 2013/0334185 A1 * | 12/2013 | Nomaru | B23K 26/02 |
| | | | 219/121.82 |
| 2014/0034624 A1 * | 2/2014 | Nomaru | B23K 26/40 |
| | | | 219/121.68 |
| 2014/0072003 A1 * | 3/2014 | Matsumoto | B23K 26/0648 |
| | | | 372/26 |
| 2016/0193698 A1 * | 7/2016 | Hildebrand | B23K 26/02 |
| | | | 219/121.69 |
| 2016/0288258 A1 * | 10/2016 | Nomura | B23K 26/0648 |

* cited by examiner

OPTICAL PROCESSING APPARATUS, METHOD FOR OPTICAL PROCESSED OBJECT

CROSS-REFERENCE TO RELATED APPLICATIONS

This patent application is based on and claims priority pursuant to 35 U.S.C. § 119(a) to Japanese Patent Application No. 2017-043970, filed on Mar. 8, 2017 in the Japan Patent Office, the entire contents of which are hereby incorporated by reference herein in entirety.

BACKGROUND

Technical Field

Embodiments of the present disclosure relate to an optical processing apparatus, and a method for producing an optical object to be processed.

Related Art

An optical processing apparatus such as a laser processing apparatus for processing an object to be processed by scanning a laser beam is known. Further, in such an optical processing apparatus, it is known to shape light using various optical parts.

The laser irradiation apparatus may include a laser oscillator, a focal lens, and a diffractive optical element. After being emitted from the laser oscillator, the diffractive optical element shapes the spot shape as the cross-sectional shape of the laser beam before reaching the semiconductor film as the object to be processed. In a laser irradiation apparatus like that described above, it may be said that by linearly shaping the spot shape of the laser light by the diffractive optical element, it is possible to enlarge the area where laser annealing can be performed at once.

In addition, some kinds of optical processing systems such as, a system that uses an astigmatism optical system including a cylindrical lens in order to make a shape of a focus image formed by focusing and irradiating laser light into a tetrahedral shape, and a system that employs a divergence modulation system and monitors a beam to correct the beam divergence and shape, are known.

However, although it is important that the deformation of the spot shape of the processing beam in the vicinity of the processed surface directly reflects the processing result, it was impossible to provide any apparatus suitable for such processing. The inventor of the present disclosure has found that the ellipticity near the processed surface is an important factor among the spot shapes of the processing beam for determining the processing quality. Although the ellipticity is relatively low and the spot shape close to a perfect circle has good beam quality that can realize microfabrication, the related arts are configured so as to not realize such beam quality. As a result, good beam quality capable of realizing microfabrication could not be realized.

SUMMARY

In one aspect of this disclosure, there is provided an improved optical processing apparatus including a light source, a condensing optical system, a shaping optical system. The light source emits light. The condensing optical system condenses the light emitted from the light source onto a processing target position on a surface of an object to be processed. The shaping optical system shapes a spot shape of the condensed light, such that a ratio of a major axis diameter of the spot shape to a minor axis diameter of the spot shape, in a cross section orthogonal to an optical axis of the condensed light on the object to be processed, is a minimum at or adjacent to a focal position of the shaping optical system.

In another aspect of this disclosure, there is provided an optical processing apparatus including a light source, a condensing optical system, a shaping optical system. The light source emits light. The condensing optical system condenses the light emitted from the light source on a processing target position on a surface of an object to be processed. The shaping optical system shapes a cross-sectional shape of the condensed light in a plane perpendicular to an optical axis of the condensed light that processes the object. The shaping optical system includes a focal optical system which differentiates a focal position according to a position in a predetermined direction on a virtual plane which is orthogonal to the optical axis of the condensed light, and a focal position changing mechanism which changes each of a plurality of the focal positions corresponding to a respective one of a plurality of the positions in the predetermined direction.

In still another aspect of this disclosure, there is provided an improved method for optical processed object including condensing light emitted from a light source onto a processing target position on a surface of the object to be processed, and shaping a spot shape of the condensed light, such that a ratio of a major axis diameter of the spot shape to a minor axis diameter of the spot shape, in a cross section orthogonal to an optical axis of the condensed light on the object to be processed, is a minimum at or adjacent to a focal position of the shaping optical system.

BRIEF DESCRIPTION OF THE DRAWINGS

The aforementioned and other aspects, features, and advantages of the present disclosure will be better understood by reference to the following detailed description, when considered in connection with the accompanying drawings, of which.

DETAILED DESCRIPTION

Figure 1:
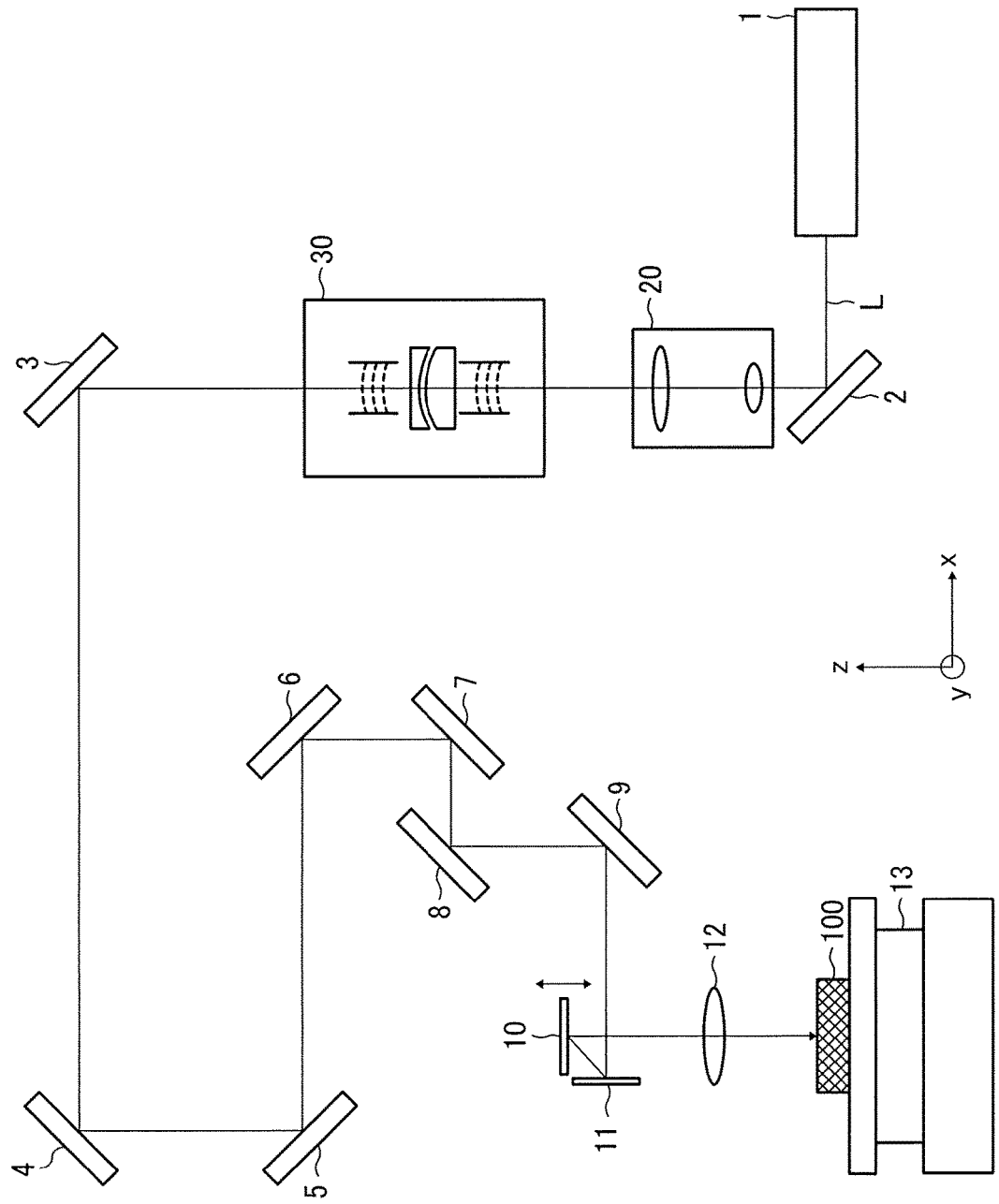
FIG. 1 is an illustration of a schematic configuration of a laser processing apparatus according to an embodiment of the present disclosure.

In describing embodiments illustrated in the drawings, specific terminology is employed for the sake of clarity. However, the disclosure of this patent specification is not intended to be limited to the specific terminology so selected, and it is to be understood that each specific element includes all technical equivalents that have the same function, operate in a similar manner, and achieve similar results.

Although the embodiments are described with technical limitations with reference to the attached drawings, such description is not intended to limit the scope of the disclosure and all of the components or elements described in the embodiments of this disclosure are not necessarily indispensable.

Hereinafter, an embodiment of a laser processing apparatus will be described as an optical processing apparatus to which the present disclosure is applied. Incidentally, the optical processing apparatus includes an ITO patterning apparatus, a laser marking apparatus, a 3D printing apparatus, and the like. That is, the optical processing apparatus includes not only an apparatus that performs removal processing such as cutting and drilling but also an apparatus that performs processing such as layered manufacturing that irradiates light and melts and solidifies by heating.

First, the basic configuration of the laser processing apparatus according to the embodiment will be described. FIG. 1 is a schematic configuration of a laser processing apparatus according to the embodiment. In this figure, the x-direction indicates the height direction (vertical direction) in the world. In addition, the x-direction and the y-direction indicate mutually orthogonal directions in the horizontal plane.

The laser processing apparatus includes a laser oscillator 1 for oscillating a laser beam, eight folding mirrors (2 to 9), an x deflecting mirror 10, a y deflecting mirror 11, a focal lens 12 as a condensing mechanism, an xy table 13, and the like. It also has a beam expander 20, a shaping optical system 30, and the like.

The laser light L emitted from the laser oscillator 1 is reflected by a surface of the first folding mirror 2, and then, it enters the beam expander 20 to be spread to an appropriate beam diameter. After that, the laser light L enters the shaping optical system 30, shapes the spot shape as a sectional shape, and then sequentially reflects on the surfaces of the folding mirrors (3 to 9) used for three-dimensional scanning. Then, the laser light L is reflected on a surface of the x deflecting mirror 10 and deflected in the x-direction, and then is reflected on a surface of the y deflecting mirror 11 and is deflected in the y-direction. Then, by passing through the focal lens 12, the laser light L is focused on a processing position of a surface of an object to be processed 100.

The object to be processed 100 is fixed to a surface of the xy table 13 which is individually movable in the x-direction and the y-direction. By moving the xy table 13 in the x-direction and the y-direction, the processing position for the object to be processed 100 is changed in the x-direction and the y-direction. The movement of the xy table 13 and the irradiation of laser light from the laser oscillator 1 are controlled, for example, by a personal computer.

The laser light focused at the processing position of the object to be processed 100 destroys and erases a substance at the processing position by combustion or the like. As a result, the object to be processed 100 is processed.

In the example of FIG. 1, the shaping optical system 30 is interposed between the beam expander 20 and the second folding mirror 3. However, as long as the shaping optical system 30 is between the laser oscillator 1 and the object to be processed 100, any place can be selected.

In recent years, development of a laser processing apparatus that realizes microfabrication using a short pulse laser beam has advanced. The laser processing apparatus according to the embodiment also carries out fine processing by short wave pulse laser light. Generally, in the laser processing apparatus, a plurality of folding mirrors made of plane mirrors are provided for reasons such as precisely guiding the laser light L to the object to be processed while miniaturizing the apparatus. The laser processing apparatus according to the embodiment also has eight folding mirrors (2 to 9) as described above. In such a configuration, the spot shape of the light beam may be largely changed between a convergence position in the light traveling direction of the light beam and a position slightly deviated from the focusing position.

Figure 2:
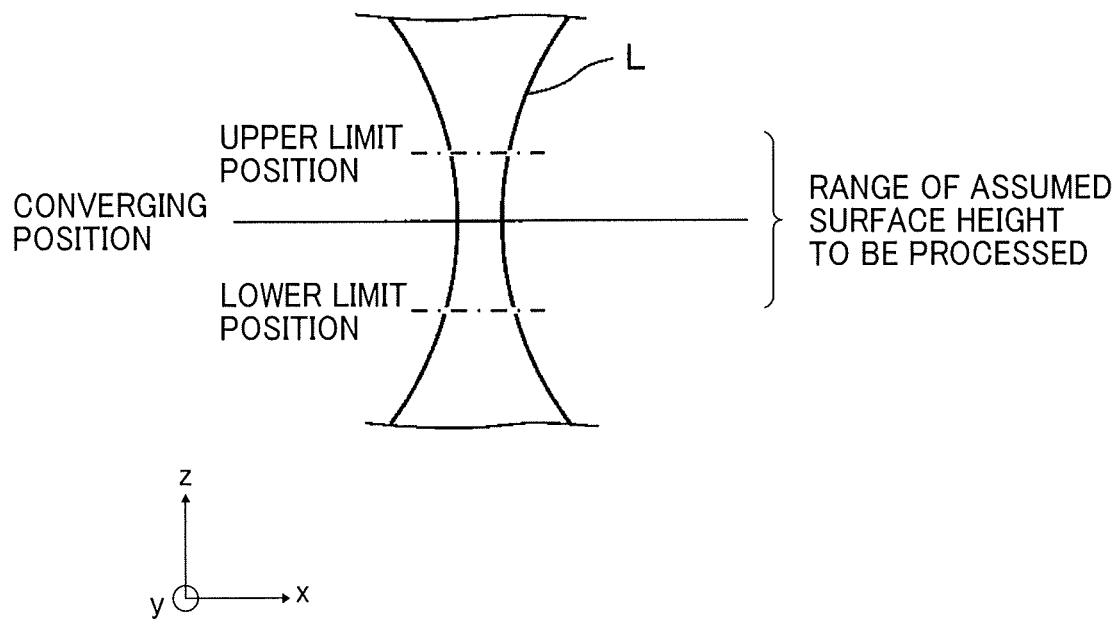
FIG. 2 is an illustration of a schematic diagram of a change range of a processed surface height of an object to be processed.
Figure 3:
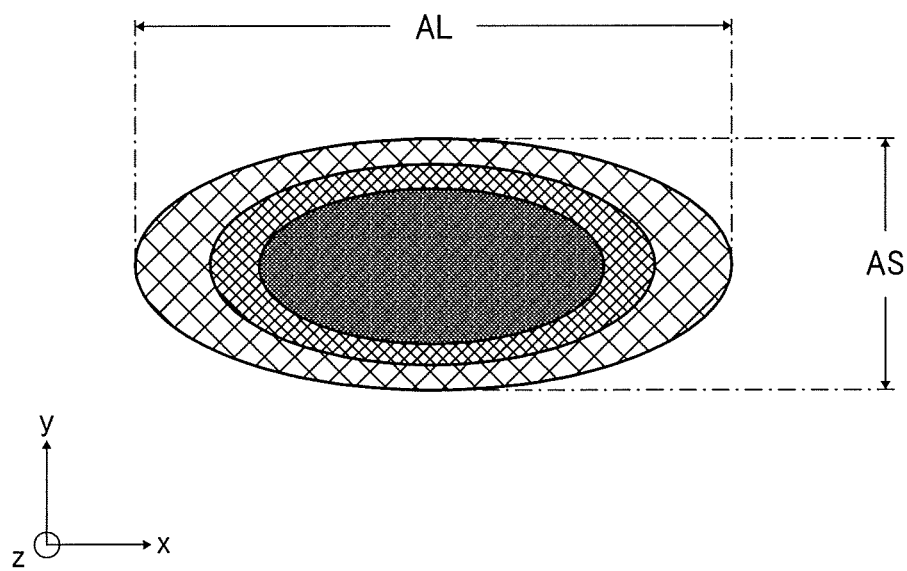
FIG. 3 is an illustration of a schematic diagram of the spot shape of light at the upper limit position of the change range.
Figure 4:
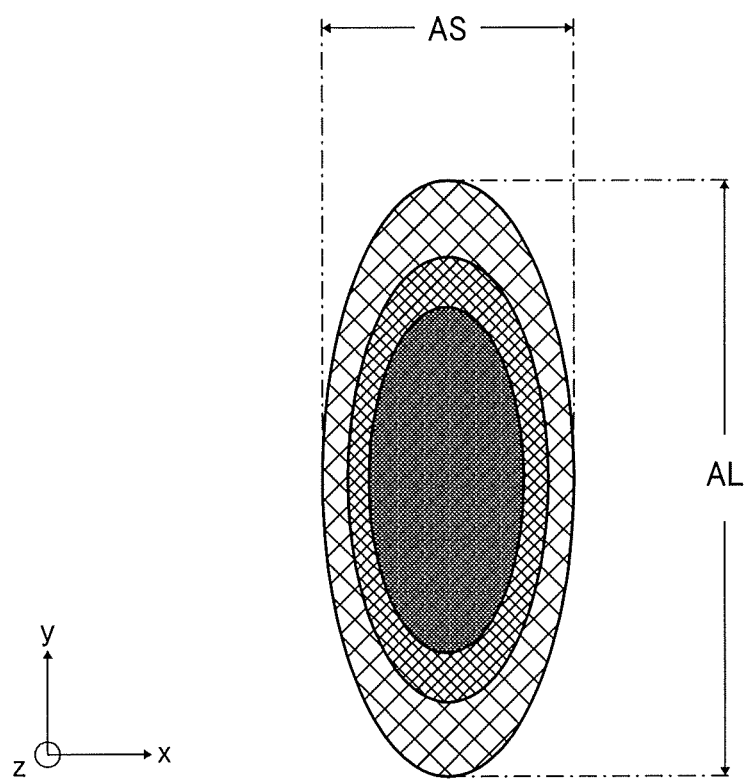
FIG. 4 is an illustration of a schematic diagram of the spot shape of light at the lower limit position of the same change range.

For example, as shown in FIG. 2, it is assumed that the laser beam L is converged at a predetermined converging position in the Z-direction while traveling in the Z-direction as indicated by an arrow in the figure. Further, it is assumed that the processed surface of the object to be processed is in the range from the upper limit position to the lower limit position in the Z-direction as shown in the figure. Under such circumstances, for example, at the upper limit position, the spot shape becomes an elliptical shape as shown in FIG. 3, whereas at the lower limit position, the spot shape may become an elliptical shape as shown in FIG. 4. The spot shape in FIG. 3 is an elliptical shape in which the major axis of the ellipse (the axis passing the position where the diameter becomes maximum) is along the x-direction on the xy plane (horizontal plane) and the minor axis of the ellipse (the axis passing the position where the diameter becomes minimum) is along the y-direction on the xy plane. On the other hand, the spot shape in FIG. 4 is an elliptical shape in which the major axis is along the y-direction and the minor axis is along the x-direction, symmetrically to the spot shape in FIG. 3.

Such a change in spot shape greatly influences the processing accuracy. Particularly, in the microfabrication such as patterning processing by ultrashort pulse laser of picosecond to femtosecond and marking, the influence is larger. As shown in FIGS. 2 to 4, the spot shape greatly changes between the upper limit position and the lower limit position because the circularity of the spot shape at the convergence position is not so high. The inventor found that if the spot shape at the convergence position is close to a perfect circle, the spot shape does not change so much between the upper limit position and the lower limit position. Therefore, in the case of short pulse laser processing, it is desirable to shape the spot shape by the shaping optical system 30 so that the spot shape at the convergence position is as close as possible to a perfect circle.

In addition, if there is a long-term temporal change in the planarity of the folding mirror, it is conceivable that the spot shape at the convergence position also changes during a long time. Therefore, as the shaping optical system 30, it is desirable to use one that can adjust the degree of shaping over a long term.

Figure 5:
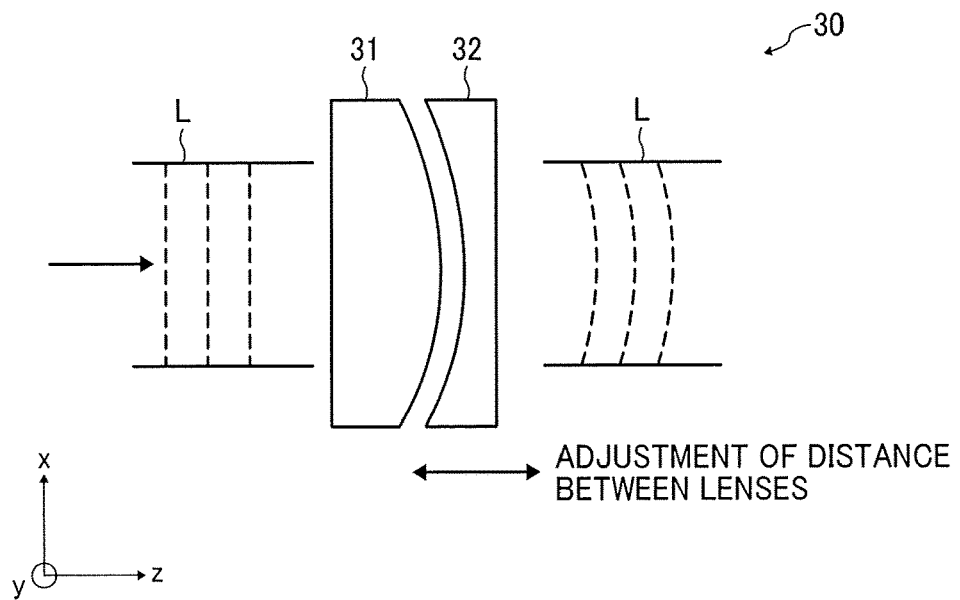
FIG. 5 is an illustration of a configuration diagram of the lens configuration in a shaping optical system of the laser processing apparatus.

Next, a characteristic configuration of the laser processing apparatus according to the embodiment will be described. FIG. 5 is a configuration diagram of the lens configuration in a shaping optical system 30 of the laser processing apparatus according to the embodiment. In the same figure, the dotted line shows the wavefront of the laser light L. The shaping optical system 30 includes a first lens 31 and a second lens 32 disposed downstream of the first lens 31 in the traveling direction of the laser beam L. The laser beam L continuously transmits through the first lens 31 and the second lens 32. As shown in the drawing, the wave front of the laser light L before entering the first lens 31 is a plane extending perpendicular to the optical axis. On the other hand, the wavefront (transmitted wavefront) of the laser light L after passing through the second lens 32 is curved from the direction perpendicular to the optical axis, as shown in the drawing.

Both the first lens 31 and the second lens 32 are cylinder lenses. The cylinder lens is a lens having a curvature that acts as a lens on only one of two mutually orthogonal virtual axes (for example, x-axis, y-axis) in a plane perpendicular to the optical axis. In the shaping optical system 30 shown in the same drawing, the first lens 31 is formed of a cylindrical convex lens and arranged so that the cylinder surface is along the x-direction. In addition, the second lens 32 is made of a cylindrical concave lens and is arranged so that the cylinder surface is along the x-direction. In this way, a system in which a cylinder convex lens and a cylinder concave lens are arranged is hereinafter referred to as a concavo-convex cylindrical lens system.

When the focal length of the first lens 31 is f 1, the focal length of the second lens 32 is f 2, and the interval (distance) between the first lens 31 and the second lens 32 is d, the composite focal length f of the two lenses is obtained by the following Equation 1.

$$\frac{1}{f} = \frac{1}{f_1} + \frac{1}{f_2} - \frac{d}{f_1 \times f_2} \qquad \text{[Equation 1]}$$

As can be seen from the Equation 1, as the distance d is shortened, the composite focal length f can be increased. For example, it is possible to realize a very long composite focal length f, with f=10000 [mm] under the condition of f1=50 [mm], f2=−50 [mm], d=0.25 [mm]. In other words, a small amount of cylinder wavefront can be superimposed on the transmitted wavefront. Furthermore, when combining the defocusing effect of the focal lens 12, it is also possible to create a 0 degree astigmatic component of the transmitted wavefront.

Further, by adjusting the interval d, it is possible to shape the spot shape so that the ratio of the minor axis diameter AS (see FIGS. 3 and 4) to the major axis diameter AL (see FIGS. 3 and 4) of the spot shape of the laser light can be made larger. In other words, in this laser processing apparatus, the proportion of the major axis diameter to the minor axis diameter of the spot shape which is a cross section orthogonal to the optical axis of the laser beam L is set to be relatively small near the focal position.

In the shaping optical system 30 having a lens configuration in which two cylinder lenses are combined, such as an uneven cylinder lens system, since the two cylinder lenses are arranged at a short distance, the shaping optical system 30 can be made compact. Furthermore, there is an advantage that the adjustment of the optical axis is easy with such a shaping optical system.

Figure 6:
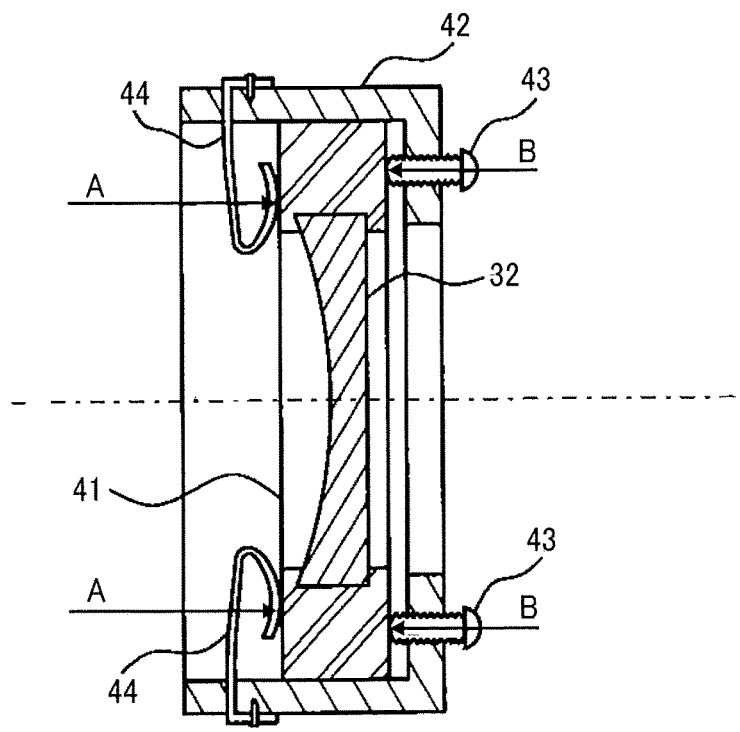
FIG. 6 is a transverse sectional view of the distance adjustment mechanism of the laser processing apparatus.

FIG. 6 is a transverse sectional view of a distance adjustment mechanism of the shaping optical system 30. In this figure, the alternate long and short dashed line shows the center axis line of the second lens 32. The extending direction of this central axis line is the same as the optical axis direction. The distance adjusting mechanism of the shaping optical system 30 includes a lens holder 41 that holds the second lens 32, a support body 42 that slidably supports the lens holder 41 in the optical axis direction, four external threads 43, four leaf springs 44 and the like. In the figure, a combination of the leaf spring 44 and the external thread 43 is disposed at a point symmetric position of 180° with respect to the center axis of the second lens 32, and only two combinations are shown. However, in reality, since the above combination is disposed at each position shifted in phase by 90° with respect to the center axis, the total number of combinations is four.

The lens holder 41 holding the second lens 32 is biased in the direction of the arrow A in the drawing by the leaf spring 44 at each of the positions phase-shifted by 90° with respect to the central axis. This arrow A direction is a direction away from the first lens 31. On the other hand, the lens holder 41 is biased by the external thread 43 in a direction diametrically opposite to the direction of the arrow A in the drawing, at each of the positions phase-shifted by 90° with respect to the central axis. The external thread 43 is screwed to the internal thread cut in the support body 42. The tip portion of the external thread 43 penetrates the internal thread and strikes the lens holder 41. When the external thread 43 is tightened by a tool and the protrusion amount of the screw tip from the support body 42 increases, the compression amount of the leaf spring 44 increases accordingly. Then, the lens holder 41 moves together with the second lens 32 from the right side to the left side shown in the FIG. 6 at the amount of the protrusion of the screw tip. On the other hand, when the external thread 43 is loosened by the tool and the protrusion amount of the screw tip from the support body 42 is reduced, the compression amount of the leaf spring 44 decreases accordingly. When the compression amount of the leaf spring 44 decreases, the lens holder 41 moves together with the second lens 32 from the left side to the right side in the figure. By performing the movement at each of the positions shifted in phase by 90°, it is possible to arbitrarily adjust the position of the second lens 32 in the optical axis direction.

When the position of the second lens 32 is adjusted by the distance adjusting mechanism, the distance d between the first lens 31 and the second lens 32 is also adjusted accordingly. In other words, the distance adjustment mechanism shown in the figure functions as distance adjustment mechanism to adjust the distance between the first lens 31 and the second lens 32.

Further, in the laser processing apparatus according to the embodiment, the combination of the first lens 31 and the second lens 32 functions as an optical system that can change the focal position according to the difference at a position in a predetermined direction (x-direction in the embodiment) along a virtual plane orthogonal to the optical axis of light.

Further, the distance adjustment mechanism functions as a focal position changing mechanism to change the focal position at a plurality of positions in the predetermined direction by changing the distance in the optical axis direction between the first lens 31 and the second lens 32 of the optical system. The reason why the distance adjusting mechanism functions as a focus position changing mechanism will be described later.

In order to improve the laser processing accuracy by the laser processing apparatus, it is necessary to accurately bring the transmission wave surface of the laser light L closer to the design value. However, in the configuration using many folding mirrors, as the number of folding mirrors increases, the transmitted wavefront accuracy decreases. Then, such a decrease causes the spot shape at the focusing position to be away from that of a perfect circle.

One way to improve the accuracy of the transmitted wavefront can be to increase the planar accuracy of the folding mirror. However, when the number of folding mirrors is large, it becomes difficult to obtain sufficient accuracy in the whole mirror optical system including all folding mirrors. For example, in a mirror optical system composed of ten folding mirrors, in order to make the transmitted wavefront accuracy $\lambda/10$ or less, it is insufficient to set the surface accuracy of each of the folding mirrors to $\lambda/20$. It is necessary to make the surface accuracy at least at $\lambda/50$, and considering the aberration of the other optical system (for example, the focal lens 12), it is sufficiently conceivable that a surface accuracy of $\lambda/100$ is necessary. Such surface accuracy is a value that easily changes due to the influence of humidity and gravity.

As another method of improving the transmission wavefront accuracy, it is conceivable to press the folding mirror from the peripheral portion toward the center, thereby deforming the folding mirror to reduce the absolute value of the plane error. And also, it can be adopted a method of pressing the peripheral portion with multiple points as the method of pressing the folding mirror. However, it has been found that when adopting a method of pressing the peripheral portion with multiple points, the following problems are caused. That is, although it is possible to reduce the absolute value of the planar error in each folding mirror, it is difficult to cancel the errors between the mirrors by making the distribution of the plane errors complicated. As a result, it is difficult to reduce the plane error by integration of the error as a whole.

In addition, when adopting a method of pressing the entire surface of the peripheral portion toward the center as the method of pressing the folding mirror from the peripheral portion toward the center, it has been found that it causes the following problems. That is, it is extremely difficult to press the entire surface of the peripheral portion with a uniform force. As a result, since it is the same as the structure pressed at many points on the micro level, the same problem occurs as when pressing at multiple points.

Meanwhile, the inventor has found through experiments that by adopting a method of pressing the folding mirror toward the center only at one point of the peripheral portion, the accuracy of the transmitted wavefront of the laser light L can be improved. This means that even if the planar accuracy of the folding mirror is not so high, if there is regularity in the planar error shape, it is possible to improve the transmitted wavefront accuracy by correcting the wavefront aberration.

Figure 7:
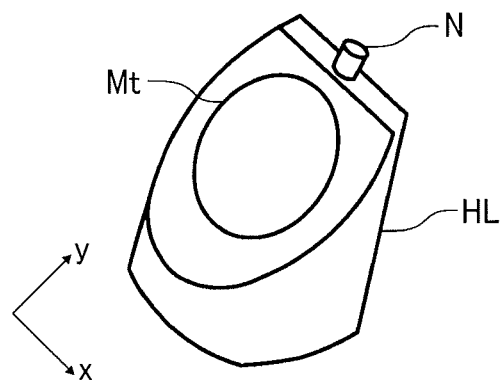
FIG. 7 is a perspective view of one of the eight folding mirrors of the laser processing apparatus together with a holder as a holding member.

FIG. 7 is a perspective view of one of the eight folding mirrors of the laser processing apparatus according to the embodiment together with a holder as a holding member. In the figure, the return mirror is labeled Mt, but this mirror Mt is one of the first folding mirror 2 to the eighth folding mirror 9 in FIG. 1.

Figure 8:
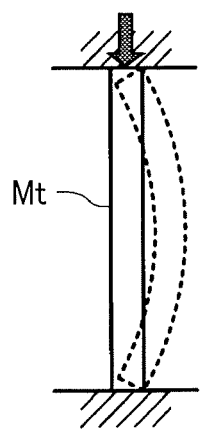
FIG. 8 is a side view of one of the folding mirrors in the laser processing apparatus.

In the figure, the folding mirror Mt is held by a holder HL in a posture in which its plane is oriented in a predetermined direction. In this holder, the internal thread is formed, and the external thread N is threaded to the internal thread. When the external thread N is tightened by a tool, as shown in FIG. 8, with its tip abutting against a point on the peripheral edge portion of the folding mirror Mt, one point thereof is directed toward the center of the mirror (in the direction of the arrow). By this pressing, as shown by a dotted line in the figure, the folding mirror Mt is deliberately bent with a certain deflection amount corresponding to the pressing amount of the external thread N. In this state, the folding mirror Mt is fixed in the uniaxial direction.

Figure 9:
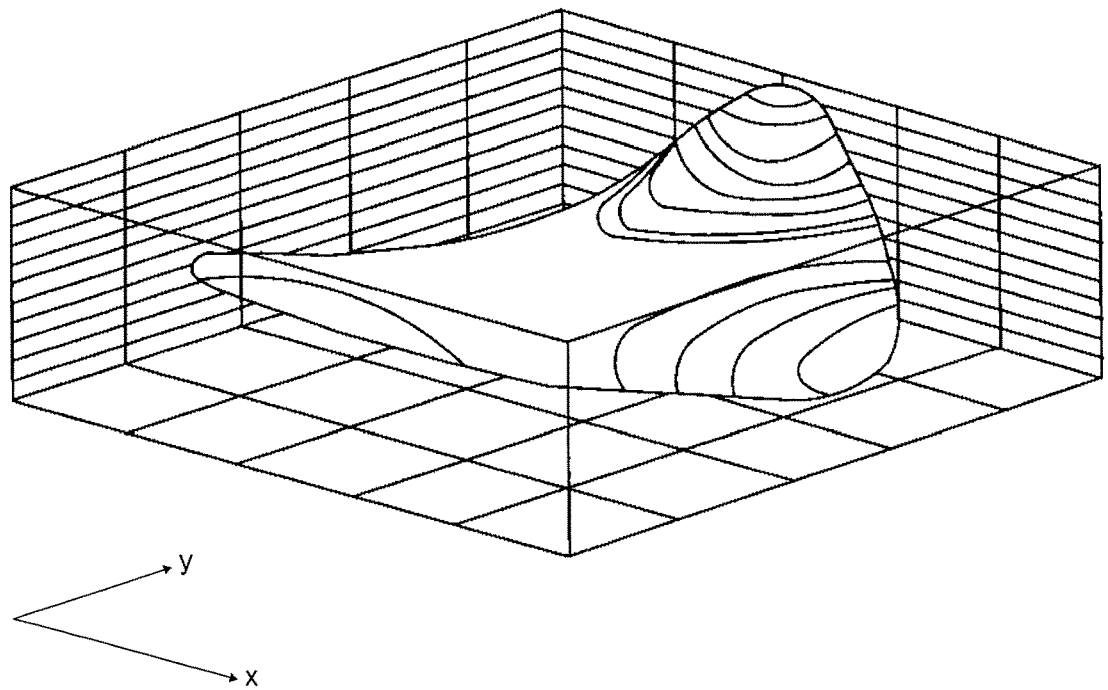
FIG. 9 is a view of an example of an error distribution from the horizontal plane of the mirror surface of the return mirror.
Figure 10:
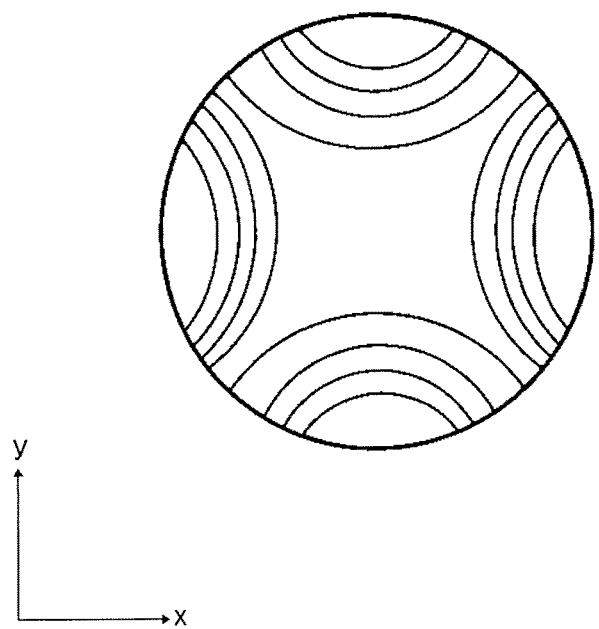
FIG. 10 is a schematic diagram of the shape of a 0 degree astigmatism component in a Zernike polynomial.

FIG. 9 shows an example of an error distribution from the horizontal plane of the mirror surface of the folding mirror Mt in such a deflected state. In this example, the p-v value which is the difference between the maximum value and the minimum value of the error was 0.418 [μm]. When the wavelength of the laser beam used as the laser beam L is 532 [nm], its p-v value corresponds to 0.79$\lambda$. The value is very large, but the shape of the error distribution (deformation shape) is simple. For this reason, it has been found that the shape almost accord to the shape of the 0 degree astigmatism component in the Zernike polynomial shown in FIG. 10. This is because the regular wavefront aberration for the laser beam L is superimposed by multiple reflections on the mirror surface of the folding mirror Mt intentionally deflected by one point pressing.

Figure 11:
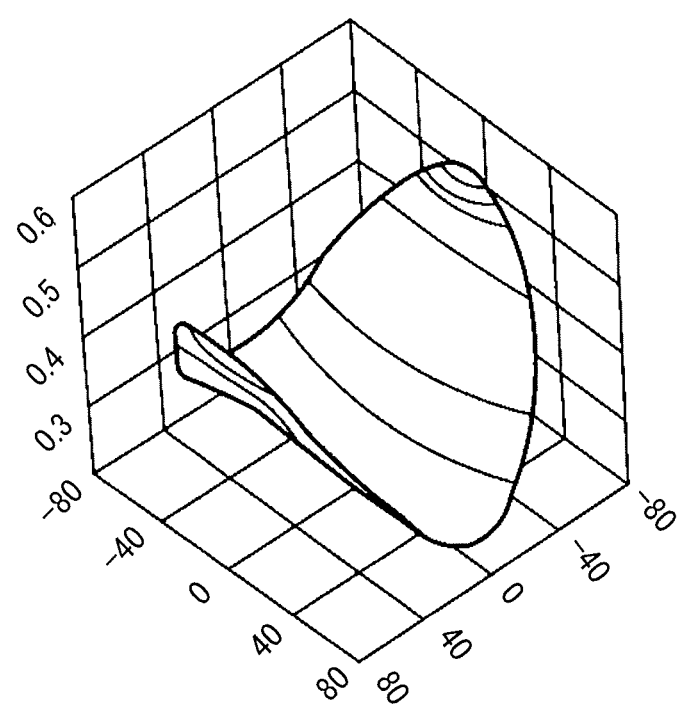
FIG. 11 is a view of a result of measurement of a transmitted wavefront on a surface of an object to be processed in a state where a focal lens is detached.

In the laser processing apparatus according to the embodiment, each of the eight folding mirrors 2 to 9 is intentionally deflected by one point pressing as shown in FIGS. 7 and 8. FIG. 11 shows the results of measurement of the transmitted wavefront on the surface of the object to be processed in a state where the focal lens 12 was removed in the testing machine having the same configuration as the laser processing apparatus according to the embodiment. It is the result of a transmission wavefront measurement by a Shack-Hartmann type wavefront sensor. As shown in the figure, it is understood that the transmitted wavefront on the surface of the object to be processed can be made to have a shape very similar to the component of the cylinder wavefront shape (0 degree astigmatism).

Therefore, in the laser processing apparatus according to the embodiment, the wavefront aberration intentionally generated by one point pressing on each of the eight folding mirrors is accumulated and the cumulating wavefront aberration is shaped by the shaping optical system 30, whereby good transmission wavefront accuracy can be realized. As a result, in the vicinity of the surface of the object to be processed, the amount of deformation of the spot shape due to the difference in the position in the optical axis direction is made very small, and the object to be processed can be processed with high accuracy.

In this laser processing apparatus, if the distance d between the first lens 31 and the second lens 32 of the shaping optical system 30 is adjusted by the above-described distance adjustment mechanism, without exchanging the first lens 31 and the second lens 32, the degree of shaping by the shaping optical system 30 can be adjusted. The reason why the degree of shaping can be adjusted by adjusting the distance d will be described in a modified embodiment to be described later.

Next, a modification in which a part of the configuration of the laser processing apparatus according to the embodiment is modified to another configuration will be described. Incidentally, unless otherwise noted, the configuration of the laser processing apparatus according to the modified embodiment is the same as that of the embodiment.

As described above, the shaping optical system 30 of the laser processing apparatus according to the embodiment adopts the concavo-convex cylinder lens system. On the other hand, the laser processing apparatus according to the modified embodiment employs a convex-concave cylinder lens system.

Figure 12:
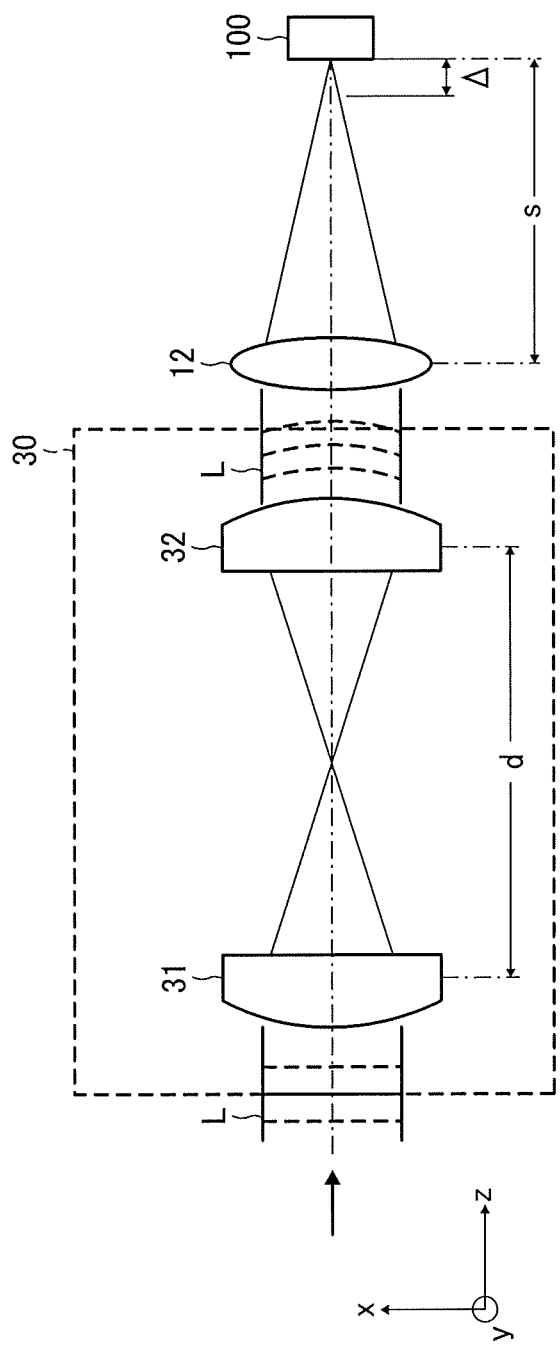
FIG. 12 is a configuration diagram of a lens configuration of a shaping optical system of a laser processing apparatus according to a modified example, together with a focal lens.

FIG. 12 is a configuration diagram of a lens configuration of the shaping optical system 30 of the laser processing apparatus according to the modified example together with the focal lens 12. In this shaping optical system 30, each of the first lens 31 and the second lens 32 is a cylinder convex lens. The cylinder surface of the first lens 31 faces the upstream side in the light traveling direction, whereas the cylinder surface of the second lens 32 faces toward the downstream side. When the distance d is adjusted such that the focal positions of the first lens 31 and the second lens 32 are overlapped with each other, the magnifications of the lenses are canceled exactly and the total magnification becomes 1, and the transmitted wave front becomes flat, just the same as the pre-transmitted wave front. Hereinafter, the interval d at this time is referred to as a reference interval.

When the distance d is shifted from the reference interval, cylinder wavefronts independent from each other are different positions in the x-direction on the surface of the object to be processed. For one of the cylinder faces, the focal position is possible to change according to the interval d. Therefore, the distance adjusting mechanism functions as a focal position changing mechanism that changes each of the focal positions at a plurality of positions in the x-direction.

By combining the effect of adjusting the focal length of one light component in the x-direction and the effect of defocusing by the focal lens 12, it is also possible to generate the 0 degree astigmatic component of the transmitted wavefront.

The inventor conducted experiments under the following conditions.
Condition of the first lens 31
Focal length: 50 [mm].
Lens type: flat convex cylinder lens.
Lens glass material: synthetic quartz.
Condition of the second lens 32
Focal length: 50 [mm].
Lens type: flat convex cylinder lens.
Lens glass material: synthetic quartz.
Condition of focal lens 12
Focal length: 100 [mm].
Lens type: axis object lens.
Glass material of lens: synthetic quartz.

In the conditions above, ray tracing simulation was performed with simulation software to calculate the distance d, the focal position S, and the defocus amount $\Delta$ of the two cylinder wavefronts. The results are shown in the following Table 1.

TABLE 1

| Distance d [mm] | Focal Length S [mm] | Defocus Amount $\Delta$ [mm] |
|---|---|---|
| 87.0 | 117.131 | 0 |
| 87.1 | 116.622 | 0.509 |
| 87.2 | 116.117 | 1.014 |
| 87.3 | 115.653 | 1.478 |
| 87.4 | 115.112 | 2.019 |
| 87.5 | 114.639 | 1.492 |

As shown in Table 1, when the distance d is shortened by about 100 [μm], the focal position S gets lengthened by about 0.5 [mm]. Thus, it is possible to adjust the difference between the focal length in the x-direction and the focal length in the y-direction. It is to be noted that instead of a cylinder lens which is integrally molded as a whole, it is possible to use a cylinder lens which is laminated with an achromatic lens or the like. Further, if an aspheric shape is used, the function of correcting aberration can be improved.

For the lens configuration shown in FIG. 6, the inventor has conducted an experiment for investigating the relationship between the deviation [mm] from the focal position on the xy plane and the spot diameter, when the defocus amount $\Delta$ is changed in four steps of −0.4, −0.2, 0, +0.2 [mm] by adjusting the distance d.

Figure 13:
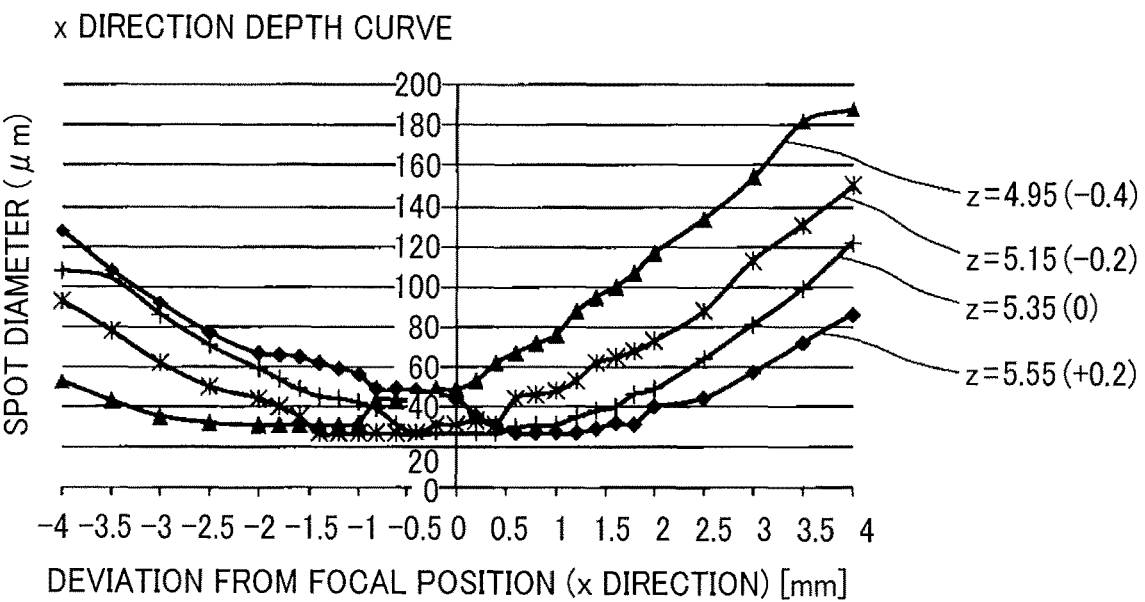
FIG. 13 is a graph of the x-direction depth curve of the relationship between the deviation amount from the focal position in the x-direction and the spot diameter.

FIG. 13 is a graph in the x-direction depth curve of the relationship between the deviation from the focal position in the x-direction and the spot diameter under this experiment. Further, FIG. 14 is a graph of the y-direction depth curve of the relationship between the deviation from the focal position in the y-direction and the spot diameter under this experiment.

Figure 14:
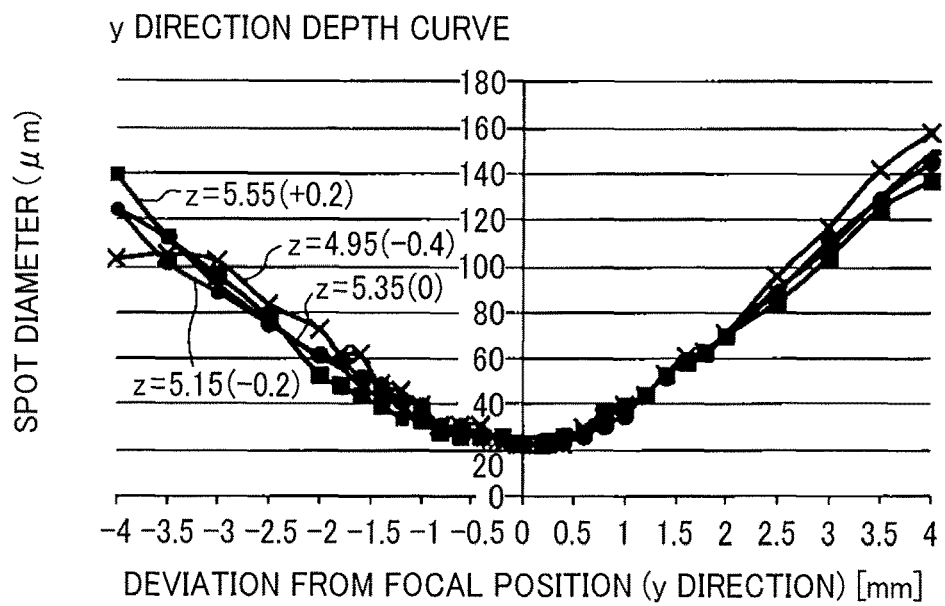
FIG. 14 is a graph of the y-direction depth curve of the relationship between the deviation amount from the focal position in the y-direction and the spot diameter.

As shown in FIG. 14, in the y-direction, the four y-direction depth curves substantially overlap each other. This is because, with respect to one light component, even if the defocus amount $\Delta$ [mm] and the position in the y-direction change, the focal position in the y-direction on the xy plane (the position where the spot diameter is minimum) is hardly changed.

On the other hand, as shown in FIG. 13, in the x-direction, the four x-direction depth curves do not overlap each other. This means that as for the other light component, as the defocus amount $\Delta$ [mm] and the position in the x-direction change, the focal position in the x-direction on the xy plane changes greatly. Therefore, by adjusting the interval d, it is possible to correct the wavefront aberration and make the spot shape close to a perfect circle. Each time the distance d is changed by 0.2 [mm], the beam waist positions are shifted by 1 [mm] only in the x-direction, which is corresponding to the simulation results described above.

When the distance between the focal position in the x-direction and the focal position in the y-direction (xy beam waist position shift amount) is set to 0.8 mm or less using the lens configuration of FIG. 6, the ellipticity of the spot shape could be suppressed to 1.5 or less. The ellipticity is the result obtained by dividing the major axis diameter AL by the minor axis diameter AS (AL/AS). When the xy beam waist position shift amount is 0.8 [mm], it means the interval d is 0.16 [mm]. This indicates that a sufficient shaping effect can be obtained by slightly changing the interval d.

Figure 15:
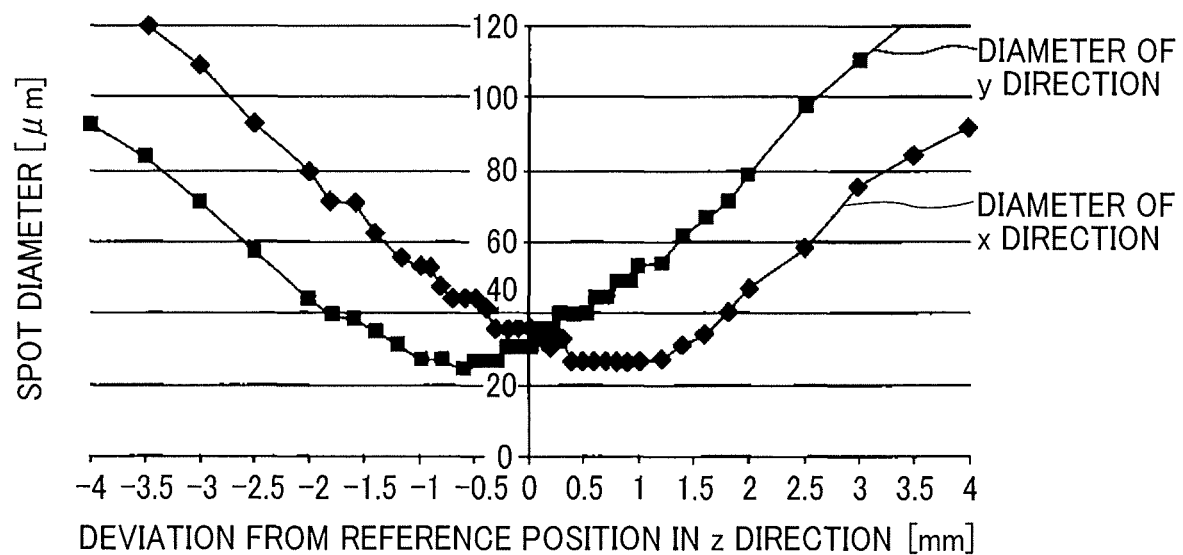
FIG. 15 is a graph of a relationship between the spot diameter and the deviation amount from a reference position (focal position) in the z-direction in a case where the spot shape of laser light is not shaped.

FIG. 15 is a graph of the relationship between the spot diameter and the deviation amount [mm] from the reference position (focal position) in the z-direction when the spot shape of the laser light L is not shaped. This was prepared based on experiments with a tester equipped with a laser light L and a focal lens 12. The wavelength of the laser light L is 532 [nm], and the focal length of the focal lens 12 is 100 [mm]. The beam diameter is measured in the range of −4 [mm] to +4 [mm] in the z-direction, taking into consideration the thickness, shape, and system error of a general object to be processed 100. Although the maximum difference between the spot diameter in the x-direction and the spot diameter in the y-direction is about 26.4 [μm], it can be seen that the difference quickly gets as large as the maximum difference when the position in the z-direction shifts only about 1.5 [mm].

Figure 16:
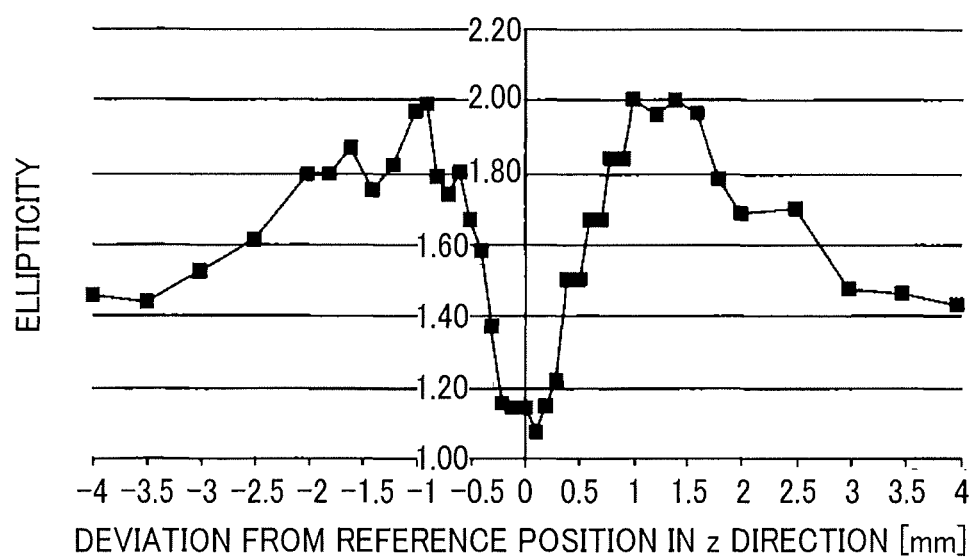
FIG. 16 is a graph of the relationship between the ellipticity obtained by a non-shaped spot shape experiment and the deviation amount from the reference position in the z-direction.

FIG. 16 is a graph of the relationship between the ellipticity obtained by the above experiment (non-shaped spot shape) and the deviation amount [mm] from the reference position in the z-direction. When the position in the z-direction shifts just about 1.5 [mm], the ellipticity becomes the maximum, 2.0. In other words, at just about 1.5 [mm] or so, the shape of the spot changes greatly, resulting in a shape far from a perfect circle.

In the experiment above (non-shaped spot shape), since the spot diameter at the focal position (deviation=0) is as large as 34 [μm], it can be said that there is practically no substantial depth margin. In performing laser processing, it is difficult to maintain good microfabrication accuracy.

Figure 17:
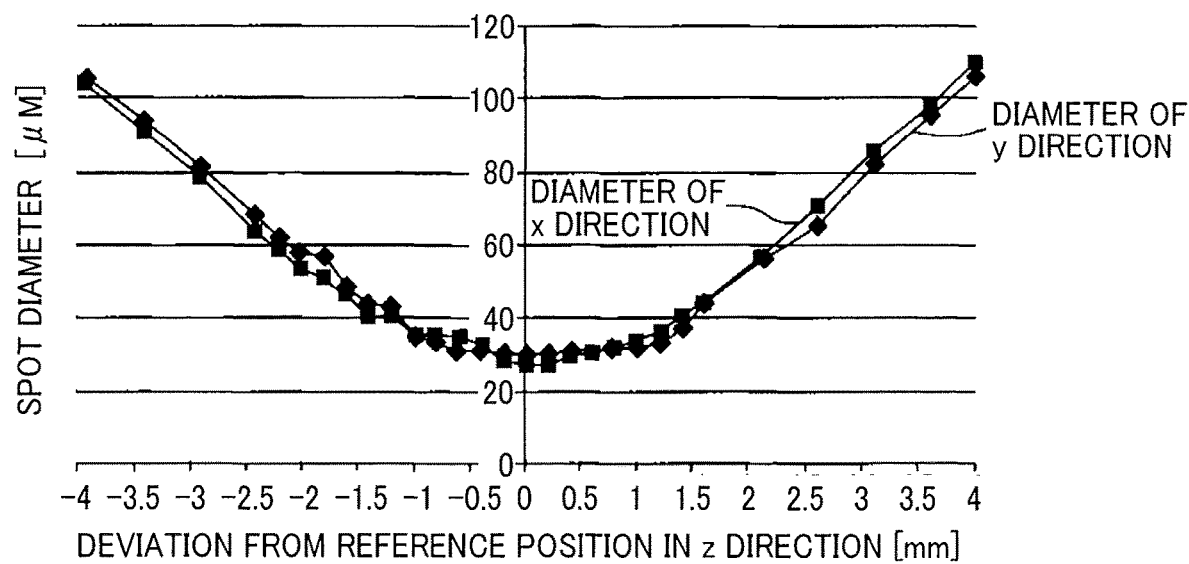
FIG. 17 is a graph of the relationship between the spot diameter and the deviation amount from the reference position in the z-direction in a case where the laser beam spot shape is shaped by the shaping optical system in the laser processing apparatus.

FIG. 17 is a graph of the relationship between the spot diameter and the deviation[mm] from the reference position in the z-direction in the case where the spot shape of the laser light L is shaped by the shaping optical system 30 in the laser processing apparatus according to the modified embodiment. The difference between this experimental condition and the experiments described above is only to shape the spot shape. As shown in the thawing, it is understood that the positions for minimizing the spot diameter overlap in the x-direction and the y-direction. In addition, the depth margin is about 2.4 [mm], which is much wider than the previous experiment. Even if the position of the processing surface of the object to be processed 100 varies in the range of −4 [mm] to +4 [mm] in the z-direction, the object to be processed 100 is processed with almost the minimum spot diameter at any position. The minimum spot diameter of the laser beam L is a geometric mean between the spot diameter in the x-direction and the spot diameter in the y-direction. Further, the depth margin is a defocus range up to +20% (average+/−10%) of the minimum spot diameter.

Figure 18:
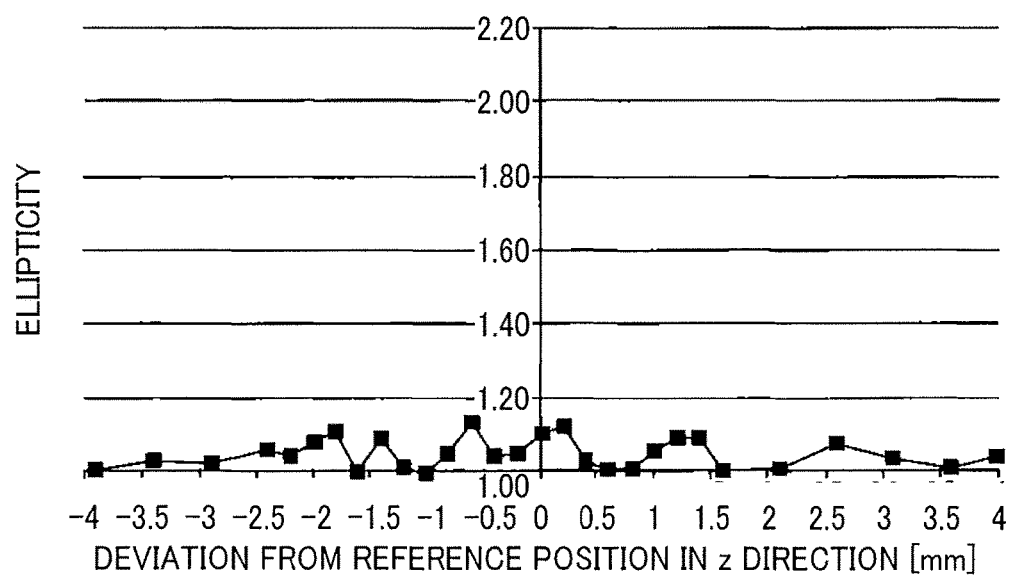
FIG. 18 is a graph of the relationship between the ellipticity of the spot shape and the deviation amount from the reference position in the z-direction when the spot shape of the laser light is shaped by the shaping optical system in the laser processing apparatus.

FIG. 18 is a graph of the relationship between the ellipticity of the spot shape and the deviation amount [mm] from the reference position in the z-direction when the spot shape of the laser light L is shaped by the shaping optical system 30 in the laser processing apparatus according to the modified embodiment. Even if the position in the z-direction of the machined surface deviates from −4 [mm] to +4 [mm] with respect to the reference position, the ellipticity is kept at 1.13 or less.

Although the shaping optical system 30 of the concavo-convex cylinder lens type and the convex-concave cylinder lens type has been described, a concave-convex cylinder lens system may be adopted. Regardless of which type of shaping optical system 30, in the plane perpendicular to the optical axis of the laser beam L, the focal position on the first axis (x axis) and the focal position on the second axis (y axis) of the optical element is different from the focal position of the rotationally asymmetric optical element.

Next, an example in which a more characteristic configuration is added to a laser processing apparatus according to an embodiment and a modified embodiment will be described. In addition, unless otherwise noted below, the configuration of the laser processing apparatus according to this example is the same as that of the above-described embodiment and the modification.

Figure 19:
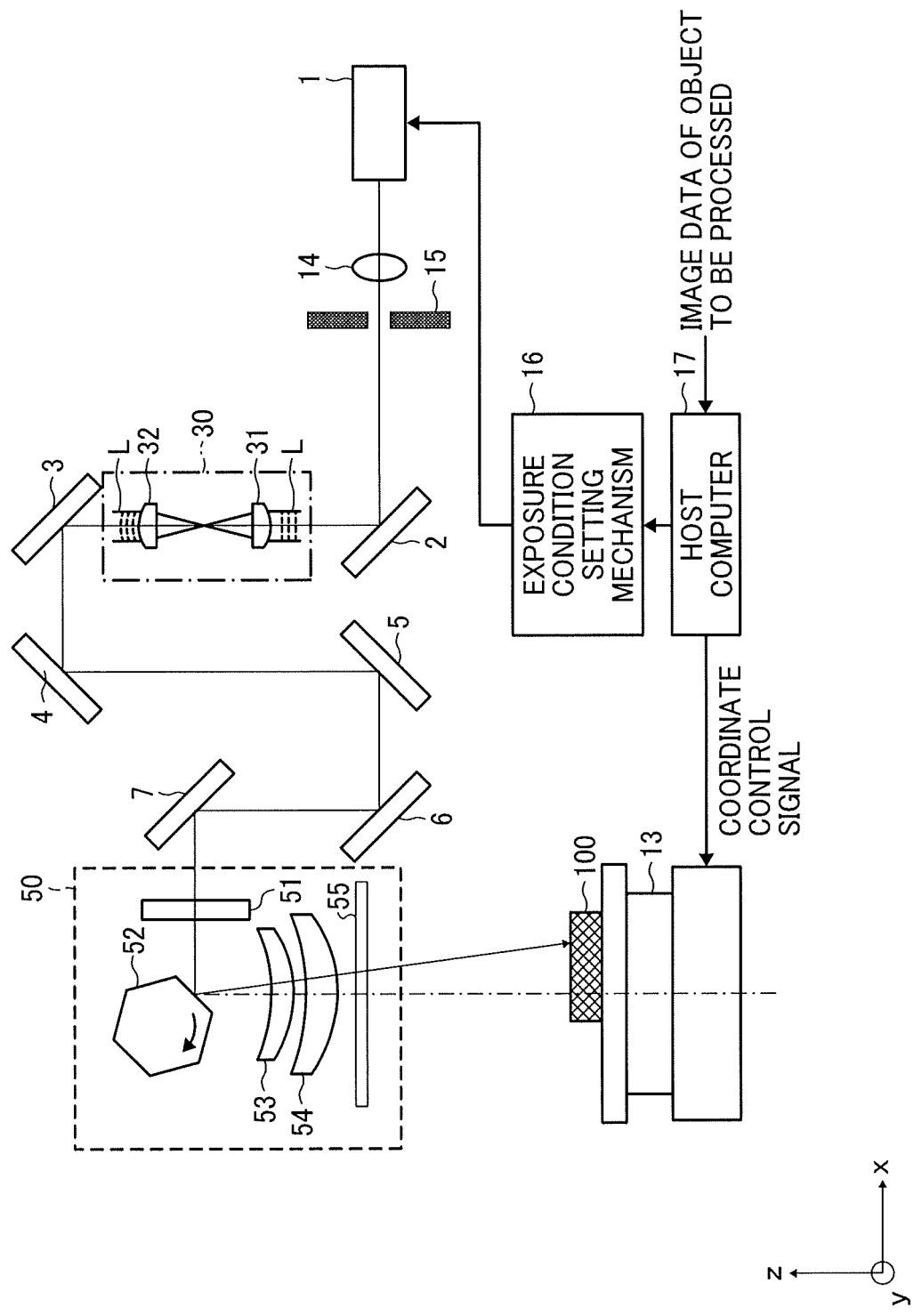
FIG. 19 is a schematic configuration diagram of a laser processing apparatus according to the embodiment.

FIG. 19 is a schematic configuration diagram of a laser processing apparatus according to the example. The laser processing apparatus includes a laser oscillator 1, a collimating lens 14, an aperture 15, exposure condition setting mechanism 16, a host computer 17, an xy table 13 and the like. It also has six folding mirrors (2 to 7), a shaping optical system 30 having the same configuration as the modified embodiment, a scanning optical system 50, and the like.

The host computer 17 acquires image data of an object to be processed created by CAD or the like, and performs predetermined processing on it. Thereafter, the image data is outputted to the exposure condition setting mechanism 16. The exposure condition setting mechanism 16 generates a modulation signal based on the exposure parameters such as the exposure area, the scanning speed, the light output intensity, and the like inputted in advance by a user and the image data sent from the host computer 17. And then, the exposure condition setting mechanism 16 outputs the modulation signal to the laser oscillator 1.

The laser oscillator 1 repeats oscillation and stop of the laser light L by turning on and off an LED diode based on the modulation signal. The laser light L oscillated from the laser oscillator 1 is converted into a parallel light flux by passing through the collimating lens 14. This makes it possible to efficiently propagate the laser light L to the optical system of the subsequent stage. In consideration of the optical design of the entire laser processing apparatus, the collimating lens 14 may be designed so that it becomes divergent light or convergent light rather than parallel.

The laser beam L transmitted through the collimating lens 14 passes through a hole of the aperture 15, whereby the peripheral portion of the light beam in the transverse section direction is cut. As a result, the spot diameter of the laser light L is cut to a desired size. The spot diameter on the surface of the object to be processed 100 is an important factor directly linked with the image quality and it is required to stably form the spot diameter with a desired size. Generally, the spot diameter is inversely proportional due to the fact that the spot diameter decreases as the size of the through hole of the aperture 15 increases. The spot diameter in microfabrication is about several tens of μm to 100 μm, and in general, the smaller the diameter, the higher the cost, but the processing quality improves. Therefore, grasping the relationship between spot diameter and processing quality is very important in realizing low cost and high speed processing.

The laser light having passed through the hole of the aperture 15 is folded back on a mirror surface of the first folding mirror 2 and then enters the shaping optical system 30. Then, the laser light L shaped so that the shape of the spot approaches a perfect circle in the shaping optical system 30 and is folded back in turn on mirror surfaces of the second, third, fourth, fifth, and sixth folding mirrors (3 to 7). Then, the laser light L enters the scanning optical system 50.

Figure 20:
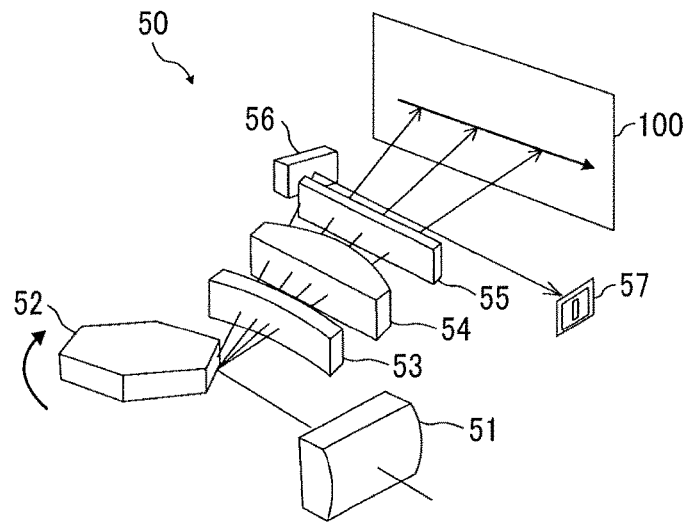
FIG. 20 is a perspective view of a main part configuration inside the scanning optical system of the laser processing apparatus, together with an object to be processed.

FIG. 20 is a perspective view of the main part configuration inside the scanning optical system 50 together with the object to be processed 100. The method of scanning the laser light L is roughly categorized into a vector scanning method and a raster scanning method, and the scanning optical system 50 adopts a raster scanning method. Instead of the raster scanning method, a vector scanning method may be adopted.

The laser beam L having entered the scanning optical system 50 first passes through cylindrical lens 51 and then reaches a light reflecting surface of polygon mirror 52 as a rotatable scanning mirror. The polygon mirror 52 has a regular hexagonal sectional shape and has a light reflecting surface at each of the six sides of a regular hexagon. The laser beam L reaching the position of the rotating polygon mirror 52 is reflected on a surface of one of the six light reflecting surfaces. The reflection angle is in accordance with the angle of the light reflecting surface at the moment of reflection, but this angle changes momentarily with the rotation of the polygon mirror 52. Hereinafter, this change is called a reflection angle change.

By passing the laser beam L through the cylindrical lens 51 just before reaching the light reflecting surface of the polygon mirror 52, condensation by the lens action is caused only in the sub scanning direction, and the laser light L is formed on the polygon surface. Note that the sub-scanning direction is a direction orthogonal to the arrow described on the surface of the object to be processed 100 in FIG. 20. Further, the main scanning direction is a direction along the arrow.

The laser beam L reflected by any one of the six light reflecting surfaces of the polygon mirror 52 passes through a scanning lens 53, a long lens 54, and a dust-proof glass 55 in that order, and basically passes through the processing surface of the object 100. However, depending on the timing (or reflection angle on the light reflecting surface of the polygon mirror 52), the laser beam L is reflected by a mirror surface of a synchronous mirror 56 without being directed to the object to be processed 100, and then received by a synchronization detecting sensor 57. Upon receiving the laser light L from the synchronous mirror 56, the synchronization detecting sensor 57 outputs a synchronization signal.

The scanning lens 53 described above corrects a speed of the reflected laser beam L which slightly differs depending on the reflection position of the light reflecting surface of the polygon mirror 52 so that the laser light L scans uniformly on the surface of the object 100.

Since a polygon motor, which is the driving source of the polygon mirror 52, performs a constant angular velocity motion, if the scanning lens 53 is not provided, an image height H equals the focal length f times tan θ, H=f·tan θ, where θ is a rotation angle of the polygon mirror. That is, as the image height increases away from the center of the object 100 to be processed, the scanning speed increases. By correcting the speed of the laser beam L reflected by the polygon mirror 52 to make H'=f·θ, where H' is an image height corrected by the scanning lens 53, the laser beam L is collected at a position proportional to the rotational speed of the polygon mirror 52 with respect to the main scanning direction.

Since the polygon motor rotates at a high speed, if a rotation irregularity exists or a machining accuracy of each light reflecting surface varies, the scanning start point shifts every scanning. Therefore, by setting the synchronous mirror 56 outside the effective scanning area of the object 100 to obtain the synchronizing signal, and determining the drive timing of the laser diode based on this, the optical scanning start point in the main scanning direction can be aligned in the sub-scanning direction.

A light source drive control device described later performs processing without positional deviation in the main scanning direction by determining the drive timing of the laser diode with reference to the synchronization signal.

The spot of the laser light L on the surface of the object to be processed 100 moves in the main scanning direction from the scanning start point to the scanning end point in the main scanning direction as the polygon mirror 52 rotates. When the spot of the laser light L reaches the scanning end point, the laser light L returns to the scanning start point shifted by one dot in the sub-scanning direction for the next scanning. At this time, the scanning start timing is measured based on the above-described synchronization signal.

Figure 21:
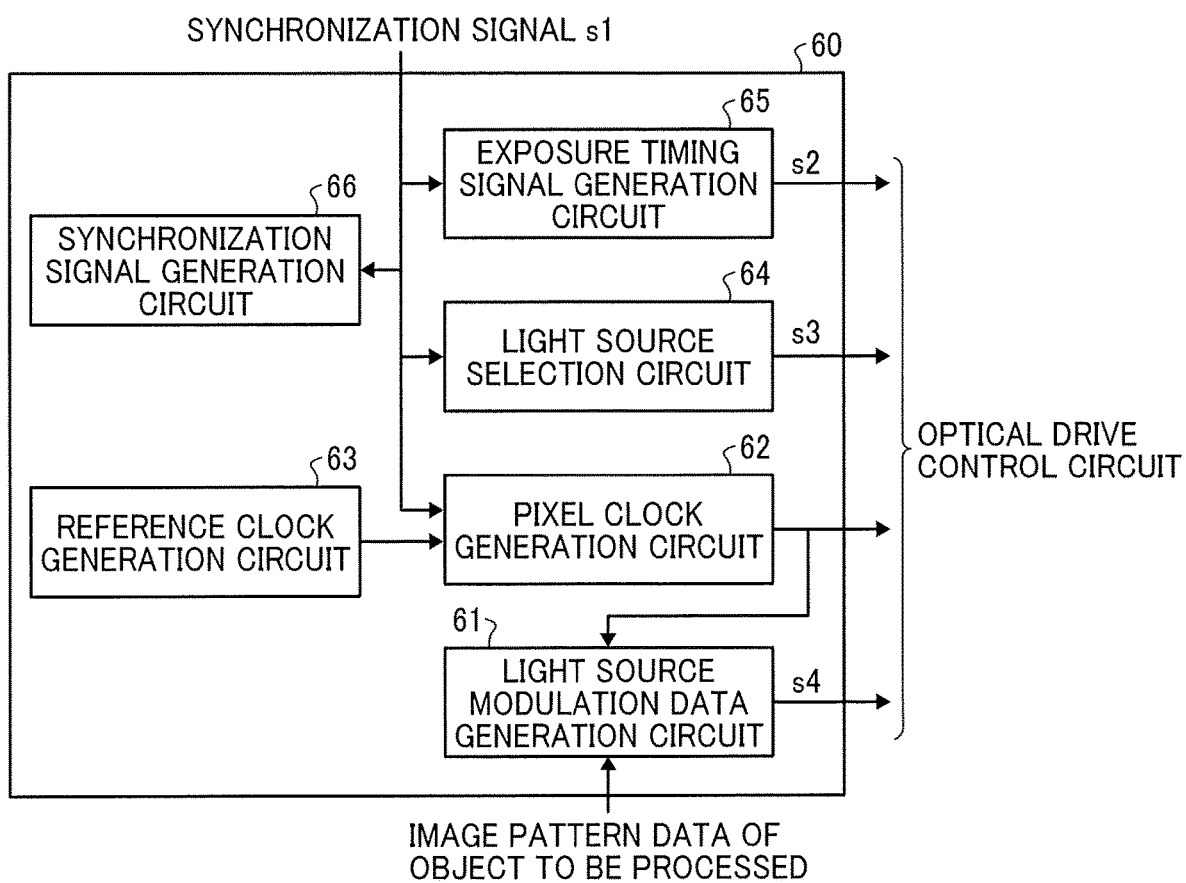
FIG. 21 is a block diagram of a circuit configuration of an optical drive control device of the laser processing apparatus.
Figure 22:
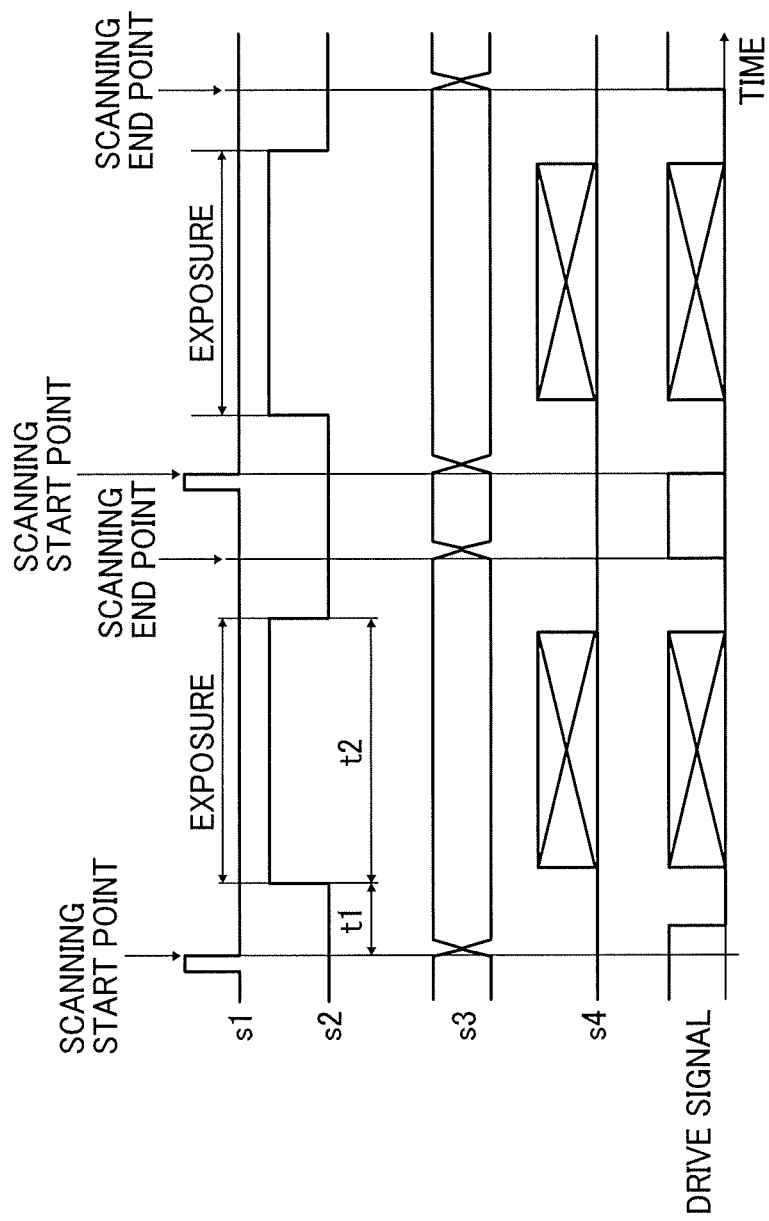
FIG. 22 is a timing chart of the timing of each process in the scanning optical system of the laser processing apparatus.

FIG. 21 is a block diagram of circuit configuration of an optical drive control device 60. FIG. 22 is a timing chart for explaining the timing of each process in the scanning optical system 50. The optical drive control device 60 includes a light source modulation data generation circuit 61, a pixel clock generation circuit 62, a reference clock generation circuit 63, a light source selection circuit 64, an exposure timing signal generation circuit 65, a synchronization signal generation circuit 66, and the like.

The reference clock generation circuit 63 generates a high-frequency clock signal as a reference for the processing of the entire optical drive control device 60. The pixel clock generation circuit 62 is mainly composed of a phase synchronization circuit and generates a pixel clock signal based on a synchronization signal s1 and a high frequency clock signal from the reference clock generation circuit 63. This pixel clock signal is the same as the high frequency clock signal, and the phase coincides with the synchronization signal s1. Therefore, by synchronizing the image data with the pixel clock signal, it is possible to align exposure positions for each scan.

The pixel clock signal is sent to a light source drive circuit (e.g., an optical drive control circuit) and is sent to the light source modulation data generating circuit 61 to be used as the clock signal of exposure data s4. The light source modulation data generation circuit 61 converts the signal into an output signal based on a signal sent from the host computer 17 so that optimum processing can be performed. When the image plane of the laser beam L reaches the scanning end point, the light source selection circuit 64 selects the light source (laser diode) used for detecting the start of the next scan and designates the selected laser diode. Output signal s3 of the light source selection circuit 64 is sent to the light source drive circuit as one of the drive information. Signal s2 output from the exposure timing signal generation circuit 65 is also sent to the light source drive circuit.

Numerous additional modifications and variations are possible in light of the above teachings. It is therefore to be understood that, within the scope of the above teachings, the present disclosure may be practiced otherwise than as specifically described herein. With some embodiments having thus been described, it will be obvious that the same may be varied in many ways. Such variations are not to be regarded as a departure from the scope of the present disclosure and appended claims, and all such modifications are intended to be included within the scope of the present disclosure and appended claims.

What is claimed is:

1. An optical processing apparatus, comprising:
a light source;
a condensing optical system to condense light emitted from the light source onto a processing target position on a surface of an object to be processed; and
a shaping optical system, including a plurality of optical elements and a focal position changing mechanism, to shape a spot shape of the condensed light, such that a ratio of a major axis diameter of the spot shape to a minor axis diameter of the spot shape, in a cross section orthogonal to an optical axis of the condensed light on the object to be processed, is a minimum at or adjacent to a focal position of the shaping optical system, the spot shape being shaped by the focal position changing mechanism changing a distance between the plurality of optical elements in a direction of the optical axis.

2. The optical processing apparatus of claim 1, wherein each of the plurality of optical elements is a cylinder lens.

3. The optical processing apparatus according to claim 1, wherein the shaping optical system includes a rotationally asymmetric optical element that differentiates between a focal position on a first axis and a focal position on a second axis that is orthogonal to the first axis, the first and second axes being in a plane perpendicular to the optical axis of the condensed light that processes the object.

4. The optical processing apparatus according to claim 1, further comprising a reflector that is arranged in an optical path from the light source to the object to be processed and that is fixed only in one axial direction.

5. An optical processing apparatus, comprising:
a light source;
a condensing optical system to condense light emitted from the light source onto a processing target position on a surface of an object to be processed;
a shaping optical system to shape a cross-sectional shape of the condensed light in a plane perpendicular to an optical axis of the condensed light that processes the object,
wherein the shaping optical system includes a focal optical system that differentiates a plurality of focal positions according to a position in a predetermined direction on a virtual plane that is orthogonal to the optical axis of the condensed light, and a focal position changing mechanism that changes each of the plurality of the focal positions corresponding to a respective one of a plurality of the positions in the predetermined direction,
wherein the focal optical system includes a plurality of optical elements, and the focal position changing mechanism changes each of the focal positions corresponding to the plurality of the positions in the predetermined direction by changing a distance between the plurality of optical elements in a direction of the optical axis.

6. The optical processing apparatus according to claim 5, wherein each of said plurality of optical elements is a cylinder lens.

7. The optical processing apparatus according to claim 5, further comprising a plurality of reflectors and a press that presses only one portion of a peripheral portion of at least one of the plurality of reflectors toward a center of the at least one of the plurality of reflectors.

8. The optical processing apparatus according to claim 5, wherein the shaping optical system shapes the cross-sectional shape so that a ratio obtained by dividing a major axis diameter of a spot shape by a minor axis diameter of the spot shape is 1.5 or less.

9. The optical processing apparatus according to claim 5, further comprising a rotatable scanning mirror including a plurality of light reflecting surfaces at a peripheral portion,
wherein a light beam is scanned on the surface of the object to be processed by deflecting the light beam while the rotatable scanning mirror is rotating and sequentially reflecting the light beam on the plurality of light reflecting surfaces.

10. A method for optically processing an object, comprising:
condensing light emitted from a light source onto a processing target position on a surface of the object to be processed; and
shaping, with a plurality of optical elements of a shaping optical system, a spot shape of the condensed light, such that a ratio of a major axis diameter of the spot shape to a minor axis diameter of the spot shape, in a cross section orthogonal to an optical axis of the condensed light on the object to be processed, is a minimum at or adjacent to a focal position of the shaping optical system, by changing a distance between the plurality of optical elements in a direction of the optical axis.

* * * * *